United States Patent
Yang et al.

(10) Patent No.: US 9,240,370 B1
(45) Date of Patent: Jan. 19, 2016

(54) POWER MODULE

(71) Applicant: Industrial Technology Research Institute, Hsinchu (TW)

(72) Inventors: Shu-Jung Yang, Tainan (TW); Yu-Lin Chao, Hsinchu (TW); June-Chien Chang, Taoyuan County (TW); Jing-Yao Chang, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/569,797

(22) Filed: Dec. 15, 2014

(51) Int. Cl.
| | |
|---|---|
| *H01L 23/495* | (2006.01) |
| *H01L 23/522* | (2006.01) |
| *H01L 23/00* | (2006.01) |
| *H01L 25/07* | (2006.01) |

(52) U.S. Cl.
CPC .... *H01L 23/49562* (2013.01); *H01L 23/49534* (2013.01); *H01L 23/49537* (2013.01); *H01L 23/49568* (2013.01); *H01L 23/49575* (2013.01); *H01L 23/5226* (2013.01); *H01L 24/29* (2013.01); *H01L 25/072* (2013.01); *H01L 2224/29022* (2013.01); *H01L 2224/29026* (2013.01); *H01L 2924/1203* (2013.01); *H01L 2924/13055* (2013.01); *H01L 2924/13091* (2013.01)

(58) Field of Classification Search
CPC ............... H05K 7/1432; H01L 25/072; H01L 23/49811; H01L 23/3735; H01L 23/24; H01L 23/049
USPC .......................................... 257/676; 361/707
See application file for complete search history.

(56) References Cited

U.S. PATENT DOCUMENTS

| | | | |
|---|---|---|---|
| 7,671,465 B2 | 3/2010 | Funakoshi et al. | |
| 8,279,605 B2 | 10/2012 | Kawanami et al. | |
| 8,604,611 B2 | 12/2013 | Hauenstein | |
| 2002/0066947 A1* | 6/2002 | Yu | H01L 21/565 257/678 |
| 2003/0015782 A1* | 1/2003 | Choi | H01L 21/565 257/686 |
| 2009/0218665 A1* | 9/2009 | Yang | H01L 23/13 257/676 |
| 2010/0295172 A1* | 11/2010 | Gao | H01L 23/142 257/712 |
| 2013/0015495 A1 | 1/2013 | Hauenstein | |

OTHER PUBLICATIONS

Wang et al., "Evaluation of Two-Phase Cold Plate for Cooling Electric Vehicle Power Electronics," Proceedings of the ASME 2011 International Mechanical Engineering Congress & Exposition, Nov. 11-17, 2011, pp. 1-11.

(Continued)

*Primary Examiner* — Dung Le
(74) *Attorney, Agent, or Firm* — Jianq Chyun IP Office

(57) ABSTRACT

A power module includes a first substrate, at least two power elements, at least one conductive structure and at least one leadframe. The first substrate includes a first dielectric layer and two first metal layers. The first dielectric layer has at least two concavities and two opposite surfaces, the two first metal layers are respectively disposed on the two surfaces, and the two concavities are respectively formed on the two surfaces. The two power elements are respectively embedded in the two concavities of the first dielectric layer. The two power elements are electrically connected to each other through the conductive structure. The leadframe disposed at the first substrate is electrically connected to the two power elements, and is partially extended outside the first substrate.

20 Claims, 4 Drawing Sheets

(56) References Cited

OTHER PUBLICATIONS

Marz et al., "Power electronics system integration for electric and hybrid vehicles," 2010 6th International Conference on Integrated Power Electronics Systems (CIPS), Mar. 16-18, 2010, pp. 1-10.

Gillot et al., "Double-sided cooling for high power IGBT modules using flip chip technology," IEEE Transactions on Components and Packaging Technologies, Dec. 2001, pp. 1521-3331.

Byon et al., "Capillary performance of bi-porous sintered metal wicks," International Journal of Heat and Mass Transfer, 2012, pp. 4096-41030.

* cited by examiner

US 9,240,370 B1

POWER MODULE

BACKGROUND

1. Technical Field

The present invention relates to a power module having embedded power elements.

2. Background

As human populations become concentrated of in cities, people's daily commuting time has gradually increased, and aging of the population has led to prolonged journey time. Therefore, personal mobility vehicles focused on vehicular space, safety and energy-saving have been gradually developed, and industries and research institutes have been actively involved in developments of related technologies.

In designs of the personal mobility vehicles, due to considerations in factors such as vehicular space, weight and operation efficiency, designs in the recent years increasingly integrate a power module and a driver integrated with an electric vehicle motor, so as to reduce the weight and the price and to increase the safety and the efficacy of the personal mobility vehicle via this integrated design. Therefore, how to effectively reduce the volume and the weight of the power module while enabling the power module to have a favorable heat dissipation ability has become a relevant research topic for those skilled in the art of the related field.

SUMMARY

The present invention is directed to a power module with a smaller size and weight and having a favorable heat dissipation ability.

The power module of the disclosure includes a first substrate, at least two power elements, at least one conductive structure and at least one leadframe. The first substrate includes a first dielectric layer and two first metal layers. The first dielectric layer has at least two concavities and two opposite surfaces, the two first metal layers are respectively disposed on the two surfaces, and the two concavities are respectively formed on the two surfaces. The two power elements are respectively embedded in two concavities of the first dielectric layer. The two power elements are electrically connected to each other through the conductive structure. The leadframe is disposed at the first substrate and electrically connected to the two power elements, and is partially extended outside of the first substrate.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a portion of this specification. The drawings illustrate exemplary embodiments and, together with the description, serve to explain the principles of the disclosure.

DETAILED DESCRIPTION OF DISCLOSED EMBODIMENTS

Figure 1:
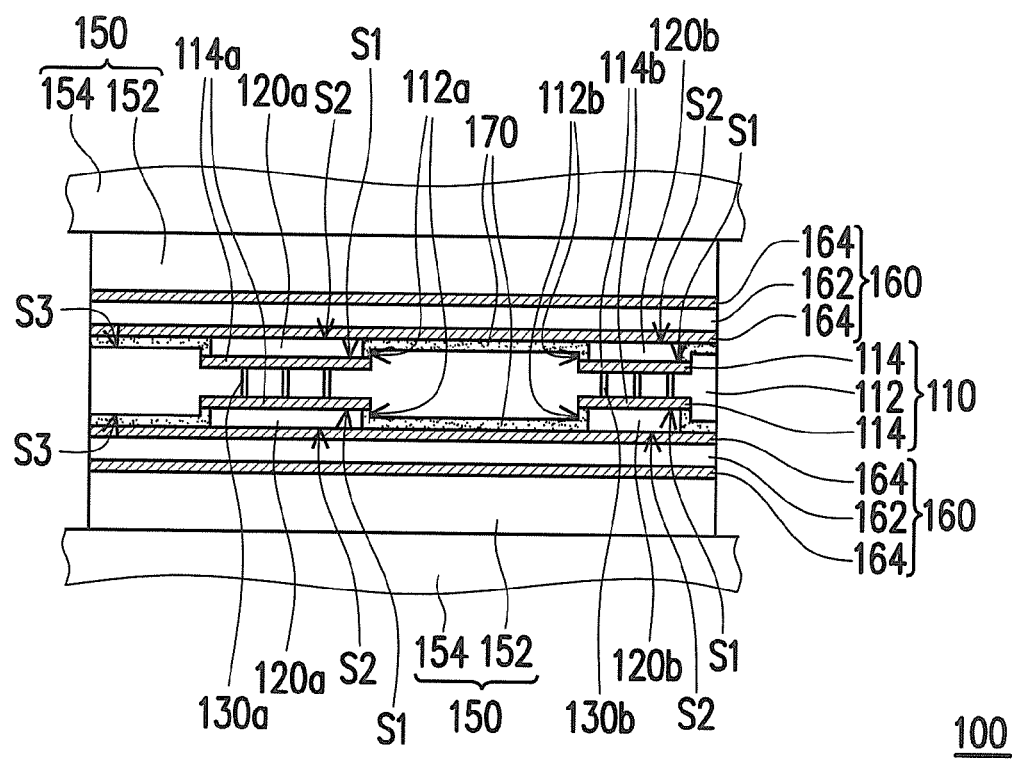
FIG. 1 is a schematic cross-sectional view illustrating a power module according to an embodiment of the invention.
Figure 2:
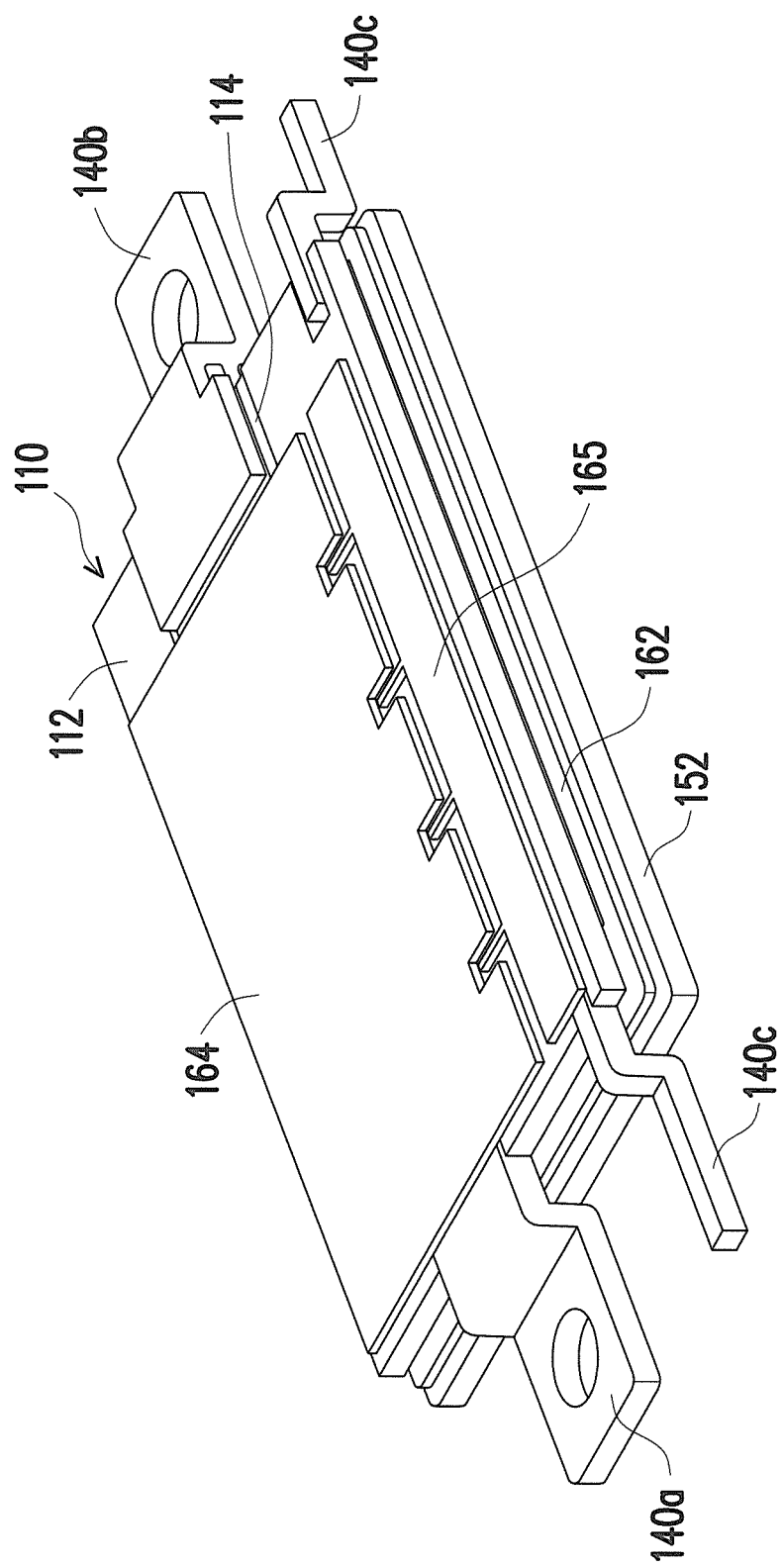
FIG. 2 is a perspective view illustrating some structures of the power module depicted in FIG. 1.
Figure 3:
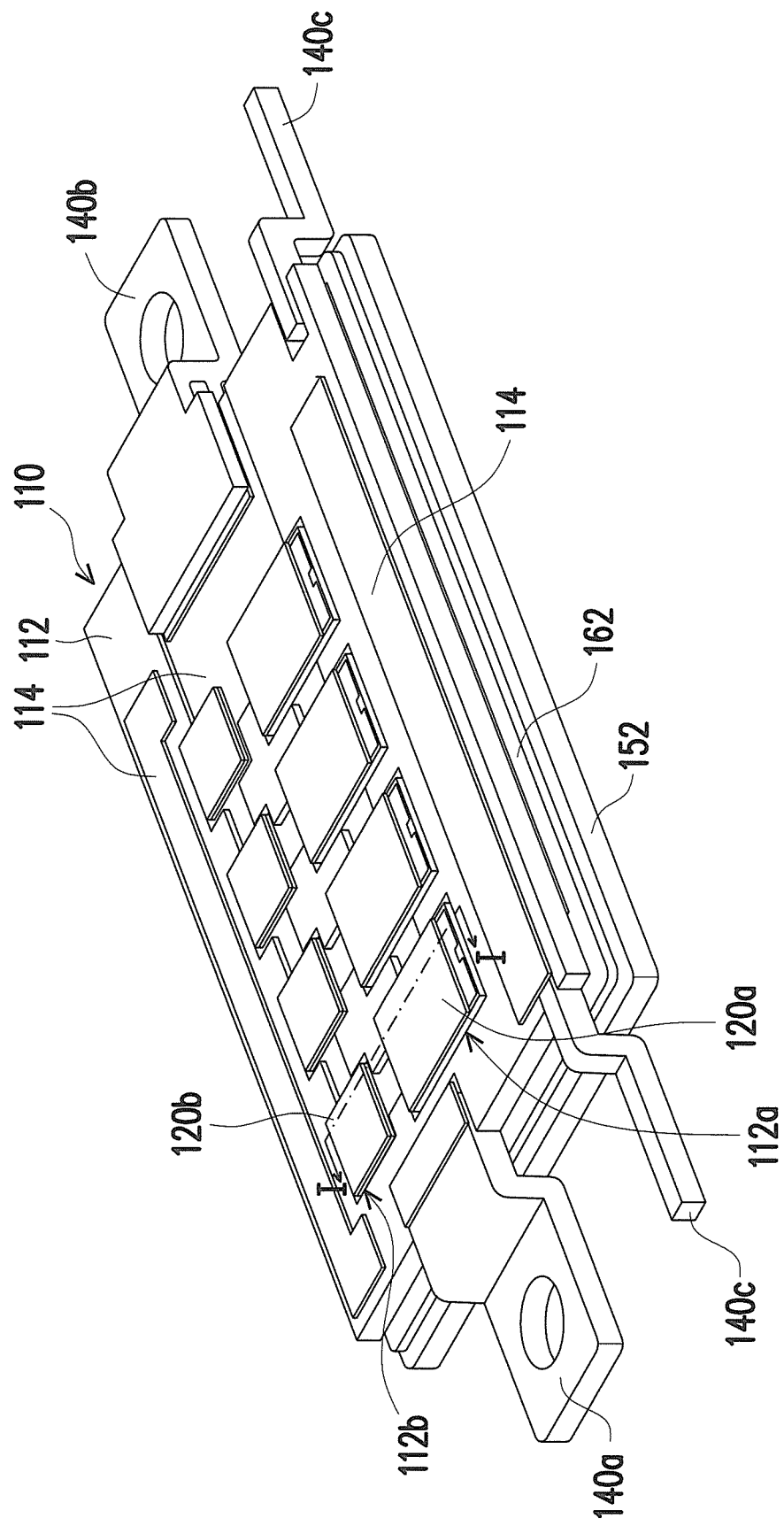
FIG. 3 is a perspective view illustrating some structures of the power module depicted in FIG. 2.

FIG. 1 is a schematic cross-sectional view illustrating a power module according to an embodiment of the invention. FIG. 2 is a perspective view illustrating some structures of the power module depicted in FIG. 1. FIG. 3 is a perspective view illustrating some structures of the power module depicted in FIG. 2. The schematic cross-sectional view as depicted in FIG. 1, for example, is corresponded to a sectional-line I-I shown in FIG. 3. Referring to FIG. 1 through FIG. 3, a power module 100 of the present embodiment includes a first substrate 110, at least two power elements (illustrated as a plurality of power elements 120a and a plurality of power elements 120b), at least one conductive structure (illustrated as a plurality of conductive structure 130a and a plurality of conductive structure 130b), at least one leadframe (illustrated as a leadframe 140a, a leadframe 140b and two leadframes 140c), and two second substrates 160. The power module 100, for example, is integrated within a power module of a motor of a personal mobility vehicle or other types of power module; the disclosure is not limited thereto.

The first substrate 110, for example, is a direct bonded copper (DBC) substrate or a direct plated copper (DPC) substrate and so forth, which includes a first dielectric layer 112 and two first metal layers 114, wherein the first dielectric layer 112, for example, is a ceramic layer, and each of the first metal layers 114, for example, is a copper layer. The first dielectric layer 112 has at least two concavities (illustrated as a plurality of concavities 112a and a plurality of concavities 112b) and two opposite surfaces S3. The two first metal layers 114 are respectively disposed on the two surfaces S3 of the first dielectric layer 112, the concavities 112a are symmetrically and respectively formed on the two surfaces S3, and the concavities 112b are symmetrically and respectively formed on the two surfaces S3. In other embodiments, the first substrate 110 may be other type of substrates, and the first dielectric layer 112 and the two first metal layers 114 may be made of other suitable materials; the disclosure is not limited thereto.

In an embodiment of the invention, a plurality of corresponding concavities 112a and 112b is formed in the first dielectric layer 112. A plurality of conductive structure 130a and 130b are formed at bottoms of the concavities 112a and 112b. The conductive structure 130a and 130b may be vias. The first metal layers 114 are respectively adhered to insides of the concavities 112a and 112b and to two ends of the conductive structure 130a and 130b. The power elements 120a and 120b are adhered on the two first metal layers 114 and located at the insides the concavities 112a and 112b.

The power elements 120a, for example, are insulated gate bipolar transistors (IGBTs) or metal-oxide-semiconductor field effect transistors (MOSFETs), which are respectively embedded in the concavities 112a. The power elements 120b, for example, are corresponded to the IGBTs or diodes of the MOSFETs, which are respectively embedded in the concavities 112b. The power elements 120a are electrically connected to each other through the conductive structure 130a, and the power elements 120b are electrically connected to each other through the conductive structure 130b. The leadframe 140a (as shown in FIG. 2 and FIG. 3) is disposed at a side of the first substrate 110 and electrically connected to the power elements 120a and the power elements 120b, and is partially extended outside of the first substrate 110. The leadframe 140b (as shown in FIG. 2 and FIG. 3) is disposed at another side of the first substrate 110 and electrically connected to the power elements 120a and the power elements 120b, and is partially extended outside of the first substrate 110. The leadframes 140c (as shown in FIG. 2 and FIG. 3) are respectively disposed at the two first metal layers 114 of the first substrate 110 and electrically connected to the power elements 120a and the power elements 120b, respectively, and are partially extended outside of the first substrate 110. The two second substrates 160 are respectively disposed at two opposite sides of the first substrate 110. In other embodiments, the power elements 120a and 120b may be other proper types of power elements and may be presented in other proper amounts; the disclosure is not limited thereto.

Under the aforementioned configuration, the power elements 120a and 120b are respectively embedded in the concavities 112a and 112b of the first dielectric layer 112, and top surfaces of the power elements 120a and 120b can be placed at a proper height through adjusting depths of the concavities 112a and 112b, thereby solving a problem in structural height difference due to the thicknesses of the power elements being inconsistent. Therefore, unlike the traditional design, the power module 100 is not required to additionally stacking metal spacers on the power elements to solve the problem in structural height difference, so that a volume and a weight of the power module 100 can effectively be reduced and thermal resistance and electrical impedance within the power module 100 can be prevented from increasing due to the power elements being additionally stacked with the metal spacers thereon, thereby enhancing a heat dissipation ability of the power module 100 and lowering a power loss. For instance, in the present embodiment, a thickness of each of the power elements 120a is designed to be equal to a depth of the corresponding concavity 112a, and a thickness of each of the power elements 120b is equal to a depth of the corresponding concavity 112b, so that top surfaces S2 (as indicated in FIG. 1) of the power elements 120a and 120b and a surface of the first dielectric layer 112 are coplanar, thereby enabling each of the second substrates 160 to successfully be in contact with the surface of the first dielectric layer 112 and the top surfaces S2 of the corresponding power elements 120a (or the power elements 120b) at the same time. A thickness difference formed by adding metal layers 114a and 114b within the concavities 112a and 112b causes a plurality of gaps being formed between the second substrate 160 and the first substrate 110, and the gaps may be filled by an encapsulation adhesive 170. In addition, gaps between the power elements 120a (or 120b) and the corresponding concavities 112a (or 112b) of the first substrate 110 may also be filled by the encapsulation adhesive 170.

The power elements 120a and 120b of the present embodiment, for example, are electrically connected to the corresponding first metal layers 114, so as to be electrically connected through a redistribution layer (RDL) constituted by the first metal layers 114 on the first dielectric layer 112, wherein the first metal layers 114, as shown in FIG. 3, are in contact with the leadframe 140b so that, unlike in the traditional design, the leadframe 140b is electrically connected to electrodes at bottom surfaces S1 (as indicated in FIG. 1) of the power elements 120a and 120b through the first metal layers 114 without requiring the use of wire bonding, thereby further reducing the volume of the power module 100.

In addition, since the power elements 120a and 120b of the present embodiment, as described in the above, are embedded in the concavities 112a and 112b of the first dielectric layer 112 rather than directly disposed on the large area of the metal layers on the dielectric layer, damages to the power elements due to a coefficient of thermal expansion mismatch (CTE mismatch) between the power elements and the large area of the metal layers can thus be prevented. Moreover, unlike the traditional power module which has only one side of the substrate being disposed with the power elements, in the power module 100 of the present embodiment, the two opposite sides of the first substrate 110 are both being disposed with the power elements 120a and 120b, and thus can increase a concentration degree of the power elements 120a and 120b and reduce an electrical transfer distance between the two power elements 120a and an electrical transfer distance between the two power elements 120b, thereby further reducing the power loss and lowering the parasitic inductance/capacitance.

As shown in FIG. 1, in the present embodiment, a portion of sectional metal layers 114a of each of the first metal layers 114 is located between a bottom surface of the corresponding concavity 112a and the corresponding power element 120a, and a portion of sectional metal layers 114b of each of the first metal layers 114 is located between a bottom surface of the corresponding concavity 112b and the corresponding power element 120b. The conductive structure 130a, for example, is a conductive via, and is disposed in the first dielectric layer 112 and located between two opposite concavities 112a opposite to each other, so that two opposite power elements 120a are electrically connected to each other through the portion of sectional metal layers 114a of each of the first metal layers 114 and the conductive structure 130a. Similarly, the conductive structure 130b of the present embodiment, for example, is a conductive via, and is disposed in the first dielectric layer 112 and located between two opposite concavities 112b, so that two opposite power elements 120b are electrically connected to each other through the portion of sectional metal layers 114b of each of the first metal layers 114 and the conductive structure 130b. The disclosure does not intend to further limit the forms and the configurations of the conductive structures 130a and 130b; in other embodiments, the conductive structure may be a metal conductive member disposed between two concavities or other suitable conductive structure, and the conductive structure may also be disposed in other suitable location in the power module.

In the present embodiment, since the two opposite sides of the first substrate 110 are both being disposed with the power elements 120a and 120b, the two opposite sides of the first substrate 110 can both be correspondingly disposed with heat dissipation devices so as to achieve a double side heat dissipation effect, and thereby further enhances the heat dissipation ability of the power module. Referring to FIG. 1, the power module 100 of the present embodiment includes two heat dissipation devices 150, the two heat dissipation devices 150 are respectively disposed at the two opposite sides of the first substrate 110, and one of the second substrates 160 is disposed between the first substrate 110 and one of the heat dissipation devices 150, while the other one of the second substrates 160 is disposed between the first substrate 110 and the other one of the heat dissipation devices 150. Heat generated by the power elements 120a and 120b may be transferred to the two heat dissipation devices 150 through the two second substrates 160.

In detail, each of the second substrates 160 includes a second dielectric layer 162 and two second metal layers 164, the two second metal layers 164 are respectively disposed at two opposite sides of the second dielectric layer 162, and one second metal layer 164, as shown in FIG. 2, is in contact with the leadframe 140a. The second substrate 160, as shown in FIG. 2, further includes a third metal layer 165, the third metal layer 165 and the second metal layers 164 shown in FIG. 2 are disposed at a same side of the second dielectric layer 162 (as shown in FIG. 1), and the third metal layer 165 is in contact with the leadframes 140c. As such, the leadframe 140a and each of the leadframes 140c are attached to and supporting at the second metal layer 164 and the third metal layer 165 of the second substrate 160, so as to act as supports and electrical transfer infrastructures for the power module 100. In addition, the power elements 120a and 120b of the present embodiment, other than being electrically connected to the corresponding first metal layer 114 such as being described in the above, may also be electrically connected to the corresponding second metal layer 164 and the third metal layer 165, so as to be electrically connected through a redistribution layer constituted by the second metal layer 164 and the third metal layer 165, thereby enabling the leadframes 140a and 140c to electrically connected to the electrodes on the top surfaces S2 (as indicated in FIG. 1) of the power elements 120a and 120b through the second metal layer 164 and the third metal layer 165 without requiring the use of wire bonding such as in the traditional design, and thus further reduces the volume of the power module 100.

As shown in FIG. 1, each of the heat dissipation devices 150 of the present embodiment includes a thermal spreading structure 152 and a heat dissipation structure 154. The heat dissipation structure 154, for example, is a set of heat dissipation fins, a water-cooling device or other types of heat dissipation structures; the disclosure is not limited thereto. The thermal spreading structure 152 is disposed between the heat dissipation structure 154 and the second substrate 160 and is bonded with the second metal layer 164 of the second substrate 160, so that heat from the power elements 120a and 120b is firstly spread through each of thermal spreading structures 152 then uniformly transferred to the corresponding heat dissipation structure 154 for enhancing a heat dissipated ability of the heat dissipation device 150.

Figure 4:
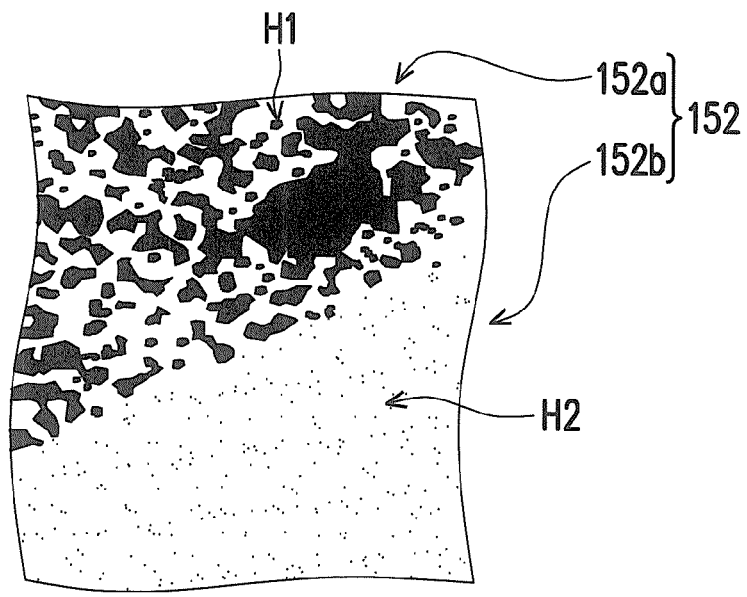
FIG. 4 is a partial enlarged view of a thermal spreading structure depicted in FIG. 1.

FIG. 4 is a partial enlarged view of the thermal spreading structure depicted in FIG. 1. In the present embodiment, each of the thermal spreading structures 152, for example, is a closed vapor chamber constituted by the porous capillary structure and working fluid, and thermally spreads through using vapors circulating within its chamber. As shown in FIG. 4, each of the thermal spreading structures 150 of the present embodiment includes a first region 152a and a second region 152b. The first region 152a has a plurality of first pores H1, the second region 152b has a plurality of second pores H2, and an aperture of each of the first pores H1 is different from an aperture of each of the second pores H2. As such, the thermal spreading structure 152 may increase an after condensation reflow rate of the working fluid via the wick aperture of the first pores H1 of the first region 152a, and may increase an evaporation rate of the working fluid within the thermal spreading structure 152 via the pore aperture of the second pores H2 of the second region 152b, so as to provide each of the thermal spreading structure 152 with a favorable thermal spreading efficiency.

Referring to FIG. 1, the power module 100 of the present embodiment includes an encapsulation adhesive 170. The encapsulation adhesive 170 is disposed between the first substrate 110 and each of the second substrates 160, a portion of the encapsulation adhesive 170 is filled between each of the power elements 120a and the inner wall of the corresponding concavity 112a, and a portion of the encapsulation adhesive 170 is filled between each of the power elements 120b and the inner wall of the corresponding concavity 112b, so as to make the overall structure more stable.

Figure 5:
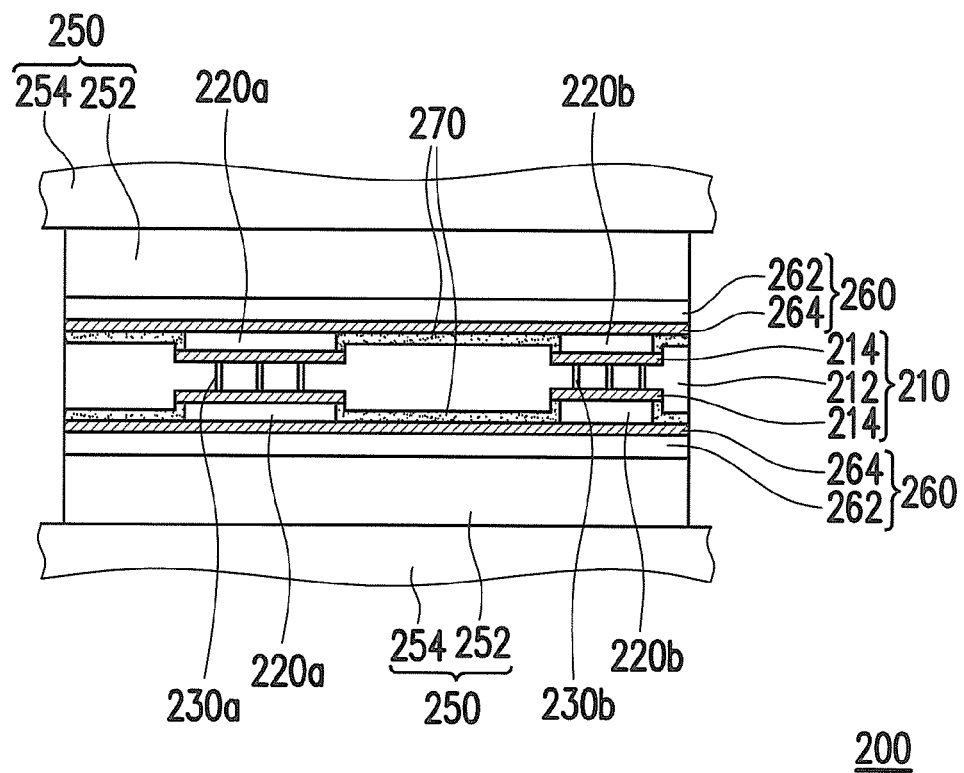
FIG. 5 is a schematic cross-sectional view illustrating a power module according to another embodiment of the invention.

FIG. 5 is a schematic cross-sectional view illustrating a power module according to another embodiment of the invention. In a power module 200 of FIG. 5, configurations and mode of actions of a first substrate 210, a first dielectric layer 212, first metal layers 214, power elements 220a, power elements 220b, a conductive structure 230a, a conductive structure 230b, heat dissipation devices 250, thermal spreading structure 252, heat dissipation structures 254, second substrates 260, second dielectric layers 262, second metal layers 264, and encapsulation adhesives 270 are similar to that of the configurations and the mode of actions of the first substrate 110, the first dielectric layer 112, the first metal layers 114, the power elements 120a, the power elements 120b, the conductive structure 130a, the conductive structure 130b, the heat dissipation devices 150, the thermal spreading structures 152, the heat dissipation structures 154, the second substrates 160, the second dielectric layers 162, the second metal layers 164, and the encapsulation adhesives 170 of FIG. 1, and thus are not to be repeated herein. A difference between the power module 100 and the power module 200 lies in that, in the power module 100, the thermal spreading structure 152 and the second dielectric layer 162 are bonded through the second metal layer 164 by soldering rather than being integrated as one; whereas in the power module 200, there is no metal layer between the second dielectric layer 262 and the thermal spreading structure 252, and the second dielectric layer 262 is directly formed on a surface of the thermal spreading structure 252 of the heat dissipation device 250 by press fitting, coating and so forth, so that the thermal spreading structure 252 and the second dielectric layer 262 is integrated as one, thereby reducing the use of a metal layer and a solder bonding layer, and thus a thermal resistance may further be lowered.

In summary, in the power module of the disclosure, the power elements are embedded in the concavities of the first dielectric layer of the first substrate, and the top surfaces of the power elements can be placed at a proper height through adjusting the depths of the concavities, thereby solving the problem in structural height difference due to the thicknesses the of the power elements being inconsistent. As such, unlike the traditional design, the power module is not required to additionally stacking metal spacers on the power elements to solve the problem in structural height difference, and thus the volume and the weight of the power module can effectively be reduced and the thermal resistance and the electrical impedance within the power module can be prevented from increasing due to the power elements being additionally stacked with the metal spacers thereon, thereby enhancing the heat dissipation ability of the power module and lowering the power loss. The power elements of the disclosure can be electrically connected through the redistribution layer constituted by the first metal layers on the first dielectric layer without requiring the use of wire bonding such as in the traditional design, and thus can further reduce the volume of the power module.

In addition, since the power elements of the disclosure are embedded in the concavities of the first dielectric layer rather than directly disposed on the large area of the metal layers on the dielectric layer, damages to the power elements due to a coefficient of CTE mismatch between the power elements and the large area of the metal layers can thus be prevented. Moreover, unlike the traditional power module which has only one side of the substrate being disposed with the power elements, in the power module of the disclosure, the two opposite sides of the first substrate are both being disposed with the power elements, and thus can increase the concentration degree of the power elements and reduce the electrical transfer distances between the power elements, thereby further reducing the power loss and lowering the parasitic inductance/capacitance. Furthermore, in the disclosure, since the two opposite sides of the first substrate are both being disposed with the power elements, the two opposite sides of the first substrate can both be correspondingly disposed with the heat dissipation devices so as to achieve the double side heat dissipation effect, and thereby further enhances the heat dissipation of the power module.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A power module, comprising:
    a first substrate, comprising a first dielectric layer and two first metal layers, wherein the first dielectric layer has at least two concavities and two opposite surfaces, the two first metal layers are respectively disposed on the two surfaces, and the at least two concavities are respectively formed on the two surfaces;
    at least two power elements, respectively embedded in the at least two concavities of the first dielectric layer;
    at least one conductive structure, wherein the at least two power elements are electrically connected to each other through the at least one conductive structure; and
    at least one leadframe, disposed at the first substrate and electrically connected to the at least two power elements, and partially extended outside of the first substrate.

2. The power module as recited in claim 1, wherein a thickness of each of the at least two power elements is equal to a depth of the corresponding concavity.

3. The power module as recited in claim 1, wherein each of the first metal layers is in contact with the at least one leadframe.

4. The power module as recited in claim 1, wherein the at least two concavities are symmetrically formed on the two surfaces of the first dielectric layer.

5. The power module as recited in claim 1, wherein the at least one conductive structure is disposed in the first dielectric layer and located between the at least two concavities.

6. The power module as recited in claim 1, wherein the at least one conductive structure is a conductive via.

7. The power module as recited in claim 1, wherein the at least one conductive structure is a metal conductive member.

8. The power module as recited in claim 1, wherein each of the at least two power elements is electrically connected to the corresponding first metal layer.

9. The power module as recited in claim 1, wherein each portion of the first metal layers is located between a bottom surface of the corresponding concavity and the corresponding power element.

10. The power module as recited in claim 1, comprising two heat dissipation devices, wherein the two heat dissipation devices are respectively disposed at two opposite sides of the first substrate.

11. The power module as recited in claim 10, comprising two second substrates, wherein one of the second substrates is disposed between the first substrate and one of the heat dissipation devices, the other one of the second substrates is disposed between the first substrate and the other one of the heat dissipation devices.

12. The power module as recited in claim 11, wherein each of the second substrates comprises a second dielectric layer and a second metal layer, and the second metal layer is disposed on the second dielectric layer and in contact with the at least one leadframe.

13. The power module as recited in claim 12, wherein the second dielectric layer is directly connected on the heat dissipation devices.

14. The power module as recited in claim 12, wherein each of the at least two power elements is electrically connected to the corresponding second metal layer.

15. The power module as recited in claim 11, comprising an encapsulation adhesive, wherein the encapsulation adhesive is disposed between the first substrate and each of the second substrates.

16. The power module as recited in claim 15, wherein a portion of the encapsulation adhesive is located between each of the at least two power elements and an inner wall of the corresponding concavity.

17. The power module as recited in claim 11, wherein each of the heat dissipation devices comprises a thermal spreading structure and a heat dissipation structure, and the thermal spreading structure is disposed between the heat dissipation structure and the second substrate.

18. The power module as recited in claim 17, wherein each of the thermal spreading structure is a porous capillary structure and comprises a first region and a second region, the first region has a plurality of first pores communicated with each other, the second region has a plurality of second pores communicated with each other, and an aperture of each of the first pores is not equal to an aperture of each of the second pores.

19. The power module as recited in claim 1, wherein the first substrate is a direct bonded copper (DBC) substrate or a direct plated copper (DPC) substrate.

20. The power module as recited in claim 1, wherein each of the power elements is an insulated gate bipolar transistor (IGBT), a metal-oxide-semiconductor field effect transistor (MOSFET) or a diode.

* * * * *